United States Patent
Daily et al.

(10) Patent No.: US 7,114,109 B2
(45) Date of Patent: Sep. 26, 2006

(54) METHOD AND APPARATUS FOR CUSTOMIZING AND MONITORING MULTIPLE INTERFACES AND IMPLEMENTING ENHANCED FAULT TOLERANCE AND ISOLATION FEATURES

(75) Inventors: James Fred Daily, Chatfield, MN (US); Steven Michael Douskey, Rochester, MN (US); Michael John Hamilton, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 306 days.

(21) Appl. No.: 10/798,912

(22) Filed: Mar. 11, 2004

(65) Prior Publication Data

US 2005/0204216 A1    Sep. 15, 2005

(51) Int. Cl.
*G01R 31/28* (2006.01)

(52) U.S. Cl. ....................................................... 714/724

(58) Field of Classification Search ...................... None
See application file for complete search history.

(56) References Cited

U.S. PATENT DOCUMENTS

| | | | | |
|---|---|---|---|---|
| 5,325,368 A | * | 6/1994 | James et al. | 714/727 |
| 6,778,526 B1 | * | 8/2004 | Brown et al. | 370/351 |
| 6,965,558 B1 | * | 11/2005 | Hann | 370/216 |
| 2004/0114509 A1 | * | 6/2004 | Miura et al. | 370/216 |

* cited by examiner

*Primary Examiner*—Christine T. Tu
(74) *Attorney, Agent, or Firm*—Joan Pennington

(57) ABSTRACT

A method and apparatus are provided for customizing and monitoring multiple interfaces, such as, multiple IEEE 1149.1 standard joint test access group (JTAG) interfaces and implementing enhanced fault tolerance and isolation features. A first interface is connected to a pair of master sources. A second interface is connected to a plurality of target interfaces; and a third interface is provided for a plurality of predefined control signals. A pair of redundant selectors is provided for coupling a select signal to the first multiplexer for selecting one of the plurality of target interfaces. A pair of redundant ATTENTION monitor functions is provided for monitoring ATTENTION signals for each of the plurality of target interfaces.

20 Claims, 3 Drawing Sheets

METHOD AND APPARATUS FOR CUSTOMIZING AND MONITORING MULTIPLE INTERFACES AND IMPLEMENTING ENHANCED FAULT TOLERANCE AND ISOLATION FEATURES

FIELD OF THE INVENTION

The present invention relates generally to the field of integrated circuit design, and more particularly, relates to a method and apparatus for customizing and monitoring multiple interfaces, such as, multiple IEEE 1149.1 standard joint test access group (JTAG) interfaces, and implementing enhanced fault tolerance and failure isolation features.

DESCRIPTION OF THE RELATED ART

At the chip level and higher, a standard interface, known as the Joint Test Action Group (JTAG) interface IEEE Std. 1149.1 has been developed to facilitate external access to integrated circuit devices. With a JTAG-compatible integrated circuit device, a standardized test access port (TAP) is provided that permits boundary scan operations to be performed in response to commands issued by an external TAP controller through the TAP port of the device, with the results output back through the same port. Through the standardized interface, card-level and system-level testing is also permitted by interfacing TAP controllers with multiple chips or cards.

Chip-level and higher interfaces such as the JTAG interface are not readily suited for use with testing multi-core designs since to do so, such interfaces would require individual cores to utilize separate JTAG controllers, thereby requiring controller circuitry to be replicated multiple times on an integrated circuit device, as well as dedicated I/O pins for each controller. Also, such interfaces are not designed to permit multiple, switchable master controllers on the same interface, which may further increase the amount of additional replicated circuitry that would be required to access multiple cores on an integrated circuit device. Considering the expense of additional circuitry and I/O pins that would be required to implement such an interface for this purpose, therefore, significant drawbacks would exist with this approach Known design arrangements have added numerous levels of buffering, with the costs of increase card real estate and delays to the interface to provide voltage leveling and signal integrity. Failure isolation and fault tolerance typically are limited to CRC on the data and with some programming for isolation on shared JTAG interfaces.

IEEE 1149.5 specifies a new unique interface and control structure which would require a significant system design change for both software and hardware, as compared to the IEEE Std. 1149.1. Texas instruments' SN54ABT8996 and the like, (ASP) allow individual addressable chips, but with one ASP for each sink. National semiconductor's SCAN-STA112 translates one JTAG interface to a number of serial scan chains. Neither addresses the fault tolerance aspects of two master sources and applicable, needed fault resolution requirements.

A need exists for an improved mechanism for use with multiple interfaces, such as multiple JTAG IEEE 1149.1 interfaces, that solves concerns in fault tolerance, failure isolation, multiple voltage level support with minimal delay and buffering, while maintaining signal integrity.

SUMMARY OF THE INVENTION

Principal aspects of the present invention are to provide a method and apparatus for customizing and monitoring multiple interfaces, such as, multiple IEEE 1149.1 standard joint test access group (JTAG) interfaces and implementing enhanced fault tolerance and isolation features. Other important aspects of the present invention are to provide such method and apparatus for customizing and monitoring multiple interfaces substantially without negative effect and that overcome many of the disadvantages of prior art arrangements.

In brief, a method and apparatus are provided for customizing and monitoring multiple interfaces, such as, multiple IEEE 1149.1 standard joint test access group (JTAG) interfaces and implementing enhanced fault tolerance and isolation features. A first interface is connected to a pair of master sources. A second interface is connected to a plurality of target interfaces; and a third interface is provided for a plurality of predefined control signals. A first multiplexer is coupled between the pair of master sources and the second interface to the plurality of target interfaces. A pair of second multiplexers is coupled between the second interface to the plurality of target interfaces and a respective one of the pair of master sources. A pair of redundant selectors is provided for coupling a select signal to the first multiplexer for selecting one of the plurality of target interfaces. A pair of redundant ATTENTION monitor functions is provided for monitoring ATTENTION signals for each of the plurality of target interfaces.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, an interface controller apparatus of the preferred embodiment is provided for maximizing interface speeds by including all buffering and re-leveling in the design and allowing many separate interfaces for reduced loading. The interface controller apparatus of the preferred embodiment is provided for supporting two JTAG master sources for fault tolerance on one or two paths, with control failure resolution, isolation and reporting. The interface controller apparatus of the preferred embodiment provides continual monitoring or masking of glitch protected ATTENTION signals for interrupts for each interface, for failure isolation. The interface controller apparatus of the preferred embodiment supports multiple separate JTAG interfaces for each field replacement unit, or scaled for manufacturing replacement unit. The interface controller apparatus of the preferred embodiment provides JTAG signal isolation for hot plugging support on either or both master and target interfaces.

Figure 1:
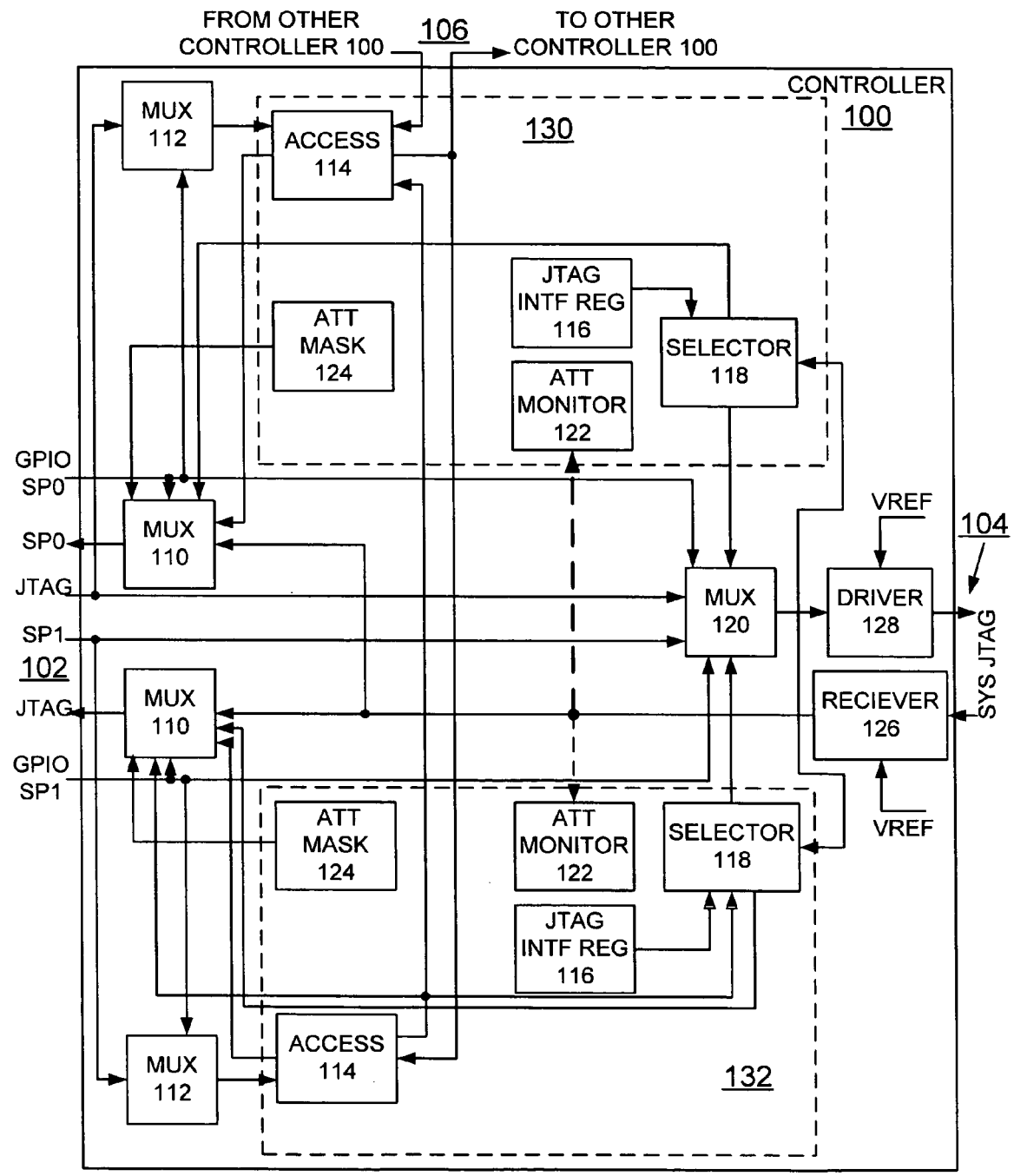
FIG. 1 is a block diagram of an exemplary interface controller apparatus for customizing and monitoring multiple interfaces and implementing enhanced fault tolerance and isolation features in accordance with the preferred embodiment.

Having reference now to the drawings, in FIG. 1, there is shown an exemplary interface controller, such as a JTAG controller generally designated by the reference character 100 for implementing enhanced fault tolerance and failure isolation features in accordance with the preferred embodiment. Interface controller apparatus 100 enables customizing and monitoring multiple interfaces, such as, multiple IEEE 1149.1 standard joint test access group (JTAG) interfaces. The JTAG interface is a serial interface in which data is input via a Test Data Input (TDI) data path and output via a Test Data Output (TDO) data path. Two control signals, Test Clock (TCK) and Test Mode Select (TMS) signals are used to control a Test Access Port (TAP) controller state machine.

Interface controller apparatus 100 connects to three major interfaces generally designated by reference character 102, 104, and 106. Interface controller apparatus 100 connects to a pair of service processors 102 SP0, SP1 including one standard 4 wire JTAG connection (TCK, TMS, TDI, TDO), and additional interrupt signal (ATTENTION) that flag errors, and some number of select signals (GPIO) for each service processor SP0, SP1. Interface controller apparatus 100 connects to a plurality of system JTAG interfaces 104, each with the additional ATTENTION signal. Interface controller apparatus 100 connects at interface 106 to a plurality of novel inter-controller apparatus control signals implemented in accordance with the preferred embodiment.

The connections to the two service processors 102, SP0, SP1 are point to point and matched to the correct voltage level. The GPIO signals are DC and connect directly to a pair of internal multiplexers (MUX) 110, 112 for connecting the JTAG interface to the selected system JTAG interface 104 when that SP interface is master. Additionally selects are assigned for an internal ACCESS function 114, an internal JTAG interface register 116, all interfaces at once and a no interface. ACCESS function 114 is selected by either of two complimentary addresses, allowing a fault tolerant retry. The internal JTAG interface register 116 is coupled to a selector 118 routes internal registers values to a multiplexer (MUX) 120 inside the interface controller apparatus 100, allowing connection for any combination of system JTAG interfaces 104 to each service processor 102. Interface controller apparatus 100 includes an ATTENTION monitor 122. Interface controller apparatus 100 includes an ATTENTION mask 124, each coupled to MUX 110. The ATTENTION monitor 122 is coupled to a receiver 126 of the system JTAG interfaces 104. The multiplexer (MUX) 120 is coupled to an output driver 128.

The connections to the system JTAG interfaces 104 are typically point-to-point and matched to correct voltage levels. Interface controller apparatus 100 supports, for example, up to 62 system JTAG interfaces 104, however it should be understood that the number of system JTAG interfaces 104 can be scaled up or down to meet a particular system's requirements. Each ATTENTION signal from each interface 104 is continually sampled and combined to drive the signal ATTENTION back to the master service processor 102. The service processor 102 can, upon receipt of an ATTENTION signal, query the internal register 122 to identify which interface 104 raised the ATTENTION signal, even if the signal has since dropped. Also included on each ATTENTION signal is a small amount of glitch protection, requiring a minimum up-time to register internally and individual interface masking.

In accordance with features of the preferred embodiment, interface controller apparatus 100 includes a pair of substantially identical, redundant controllers 130, 132 with inter connections at interface 106 between another controller apparatus 100 or between the controllers 130, 132 of a single controller apparatus 100. The inter connections at interface 106 include a MASTER, ISOLATE, RESET, and FLUSH with configurations inputs PRIORITY, EXTMASTER, DUAL, CONFIG. All of these functions include, for example, two or three signals that error correct either to the correct value or a safe state with the function disabled.

In accordance with features of the preferred embodiment, when DUAL is inactive the MASTER, FLUSH, ISOLATE, and RESET functions interact between two separate controller chips 100. When DUAL is active these functions are internal signals between each identical, redundant controllers 130, 132 of the interface controller apparatus 100.

In accordance with features of the preferred embodiment, each of the redundant controllers 130, 132 of the interface controller apparatus 100 feeds its MASTER status to the other controllers 130, 132 indicating that it is master and the other must not drive the system JTAG interfaces 104. If both are active, the PRIORITY signal, which is active only for one, is used to resolve to a single master. EXTMASTER allows an external source to assign the single master, though the MASTER function still resolves between two masters. The RESET function can be used to reset the other one of the redundant controllers 130, 132 of the interface controller apparatus 100. A GRABMASTER sequence allows one of the redundant controllers 130, 132 of the interface controller apparatus 100 to reset the master control of the other one of the redundant controllers 130, 132 of the interface controller apparatus 100, for example, when a problem exists, and optionally to take over master control. The ISOLATE function allows one of the redundant controllers 130, 132 of the interface controller apparatus 100 to isolate the other from its service processor interface 102, which is useful removing the effects of a failing part and for hot plugging. The CONFIG function allows the GPIO selectors to be redirected to a different set of system JTAG interfaces 104.

Figure 2:
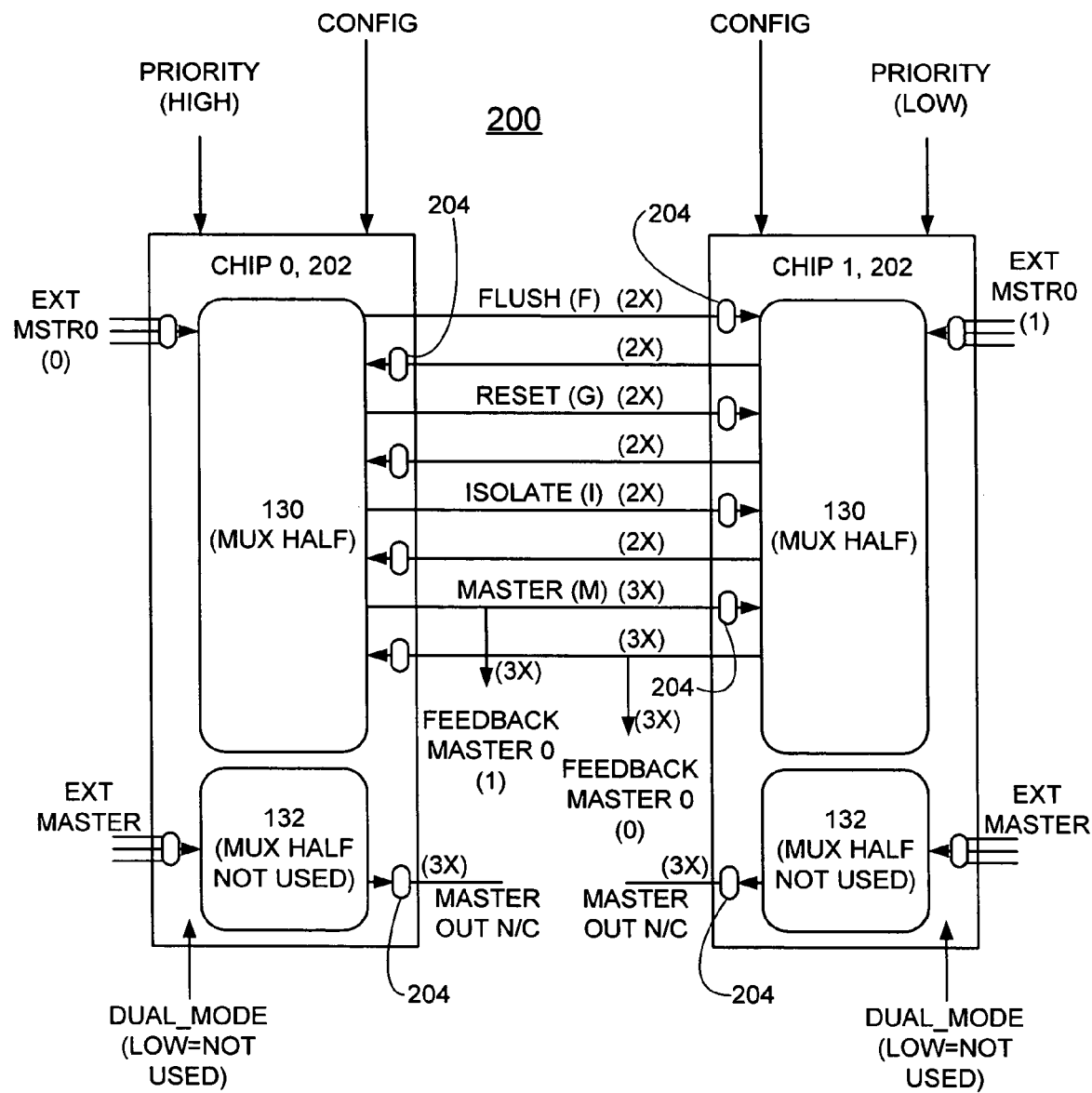
FIG. 2 is a block diagram illustrating a dual chip design for the exemplary interface controller apparatus of FIG. 1 in accordance with the preferred embodiment.

Referring now to FIG. 2, there is shown a dual chip design generally designated by reference character 200 for the exemplary interface controller apparatus 100 in accordance with the preferred embodiment. Dual chip design 200 includes a pair of field programmable gate array (FPGA) 202, CHIP 0 and CHIP 1, each for implementing redundant controllers 130, 132 of a pair of interface controller apparatus 100. The inter connections at interface 106 between the pair of field programmable gate array (FPGA) 202, CHIP 0 and CHIP 1 defining the pair of interface controller apparatus 100, each with redundant controllers 130, 132 include MASTER, ISOLATE, RESET, and FLUSH, each including parity and ECC logic 204 together with configurations inputs PRIORITY, EXTMASTER, DUAL, CONFIG.

Figure 3:
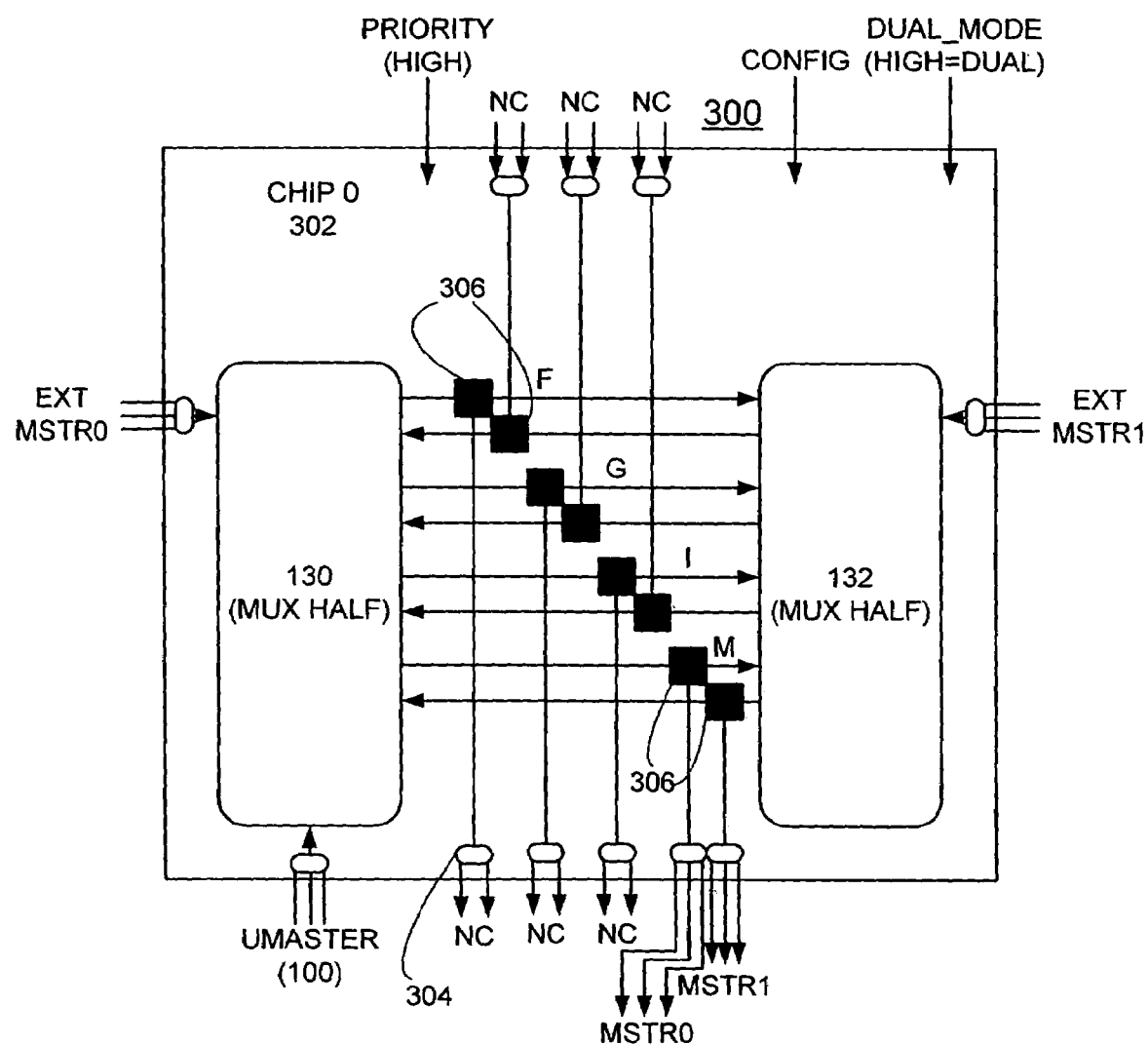
FIG. 3 is a block diagram illustrating a single chip design for the exemplary interface controller apparatus of FIG. 1 in accordance with the preferred embodiment.

Referring now to FIG. 3, there is shown a single chip design generally designated by reference character 300 for the exemplary interface controller apparatus 100 in accordance with the preferred embodiment. Single chip design 300 includes a field programmable gate array (FPGA) 302 for implementing redundant controllers 130, 132 of the interface controller apparatus 100. The inter connections at interface 106 between the redundant controllers 130, 132 include MASTER, ISOLATE, RESET, and FLUSH, each including parity and ECC logic 304 and each being gated with Dual mode control 306 with configurations inputs PRIORITY, EXTMASTER, DUAL, CONFIG.

While the present invention has been described with reference to the details of the embodiments of the invention shown in the drawing, these details are not intended to limit the scope of the invention as claimed in the appended claims.

What is claimed is:

1. Apparatus for customizing and monitoring multiple interfaces, said apparatus including an interface controller, said interface controller comprising:
   a first interface coupled to a pair of master sources;
   a second interface coupled to a plurality of target interfaces;
   a third interface coupled to a second controller for coupling a plurality of predefined control signals;
   a first multiplexer coupled between said pair of master sources and said second interface to said plurality of target interfaces;
   a pair of second multiplexers coupled between said second interface to said plurality of target interfaces and a respective one of said pair of master sources;
   a pair of redundant selector functions for coupling a select signal to said first multiplexer for selecting one of said plurality of target interfaces; and
   a pair of redundant ATTENTION monitor functions for monitoring ATTENTION signals for each of said plurality of target interfaces.

2. Apparatus as recited in claim 1 wherein the multiple interfaces include multiple IEEE 1149.1 standard joint test access group (JTAG) interfaces.

3. Apparatus as recited in claim 1 wherein said pair of master sources includes a pair of service processors.

4. Apparatus as recited in claim 1 wherein said plurality of target interfaces include a plurality of joint test access group (JTAG) interfaces.

5. Apparatus as recited in claim 1 wherein said plurality of predefined control signals include a master control signal for controlling a master status for one of each of said pair of redundant selector functions and said pair of redundant ATTENTION monitor functions.

6. Apparatus as recited in claim 1 wherein said plurality of predefined control signals include a reset control signal for resetting said second controller.

7. Apparatus as recited in claim 1 wherein said plurality of predefined control signals include an isolate control signal for isolating said second controller from said master sources.

8. Apparatus as recited in claim 1 wherein said plurality of predefined control signals include a dual configuration control signal for providing interconnecting signals between said interface controller and said second controller or providing internal interconnecting signals between said pair of redundant selector functions.

9. Apparatus as recited in claim 1 wherein said plurality of predefined control signals include an external master configuration control signal for controlling a master status for one of said redundant selector functions or for one of said interface controller and said second controller.

10. Apparatus as recited in claim 1 wherein said plurality of predefined control signals include a priority configuration control signal for controlling a master status for one of each said redundant selector and ATTENTION monitoring functions or for one of said interface controller and said second controller.

11. Apparatus as recited in claim 1 wherein said master sources include a pair of service processors; and wherein said first interface coupled to said pair of master sources include a plurality of select signals for each service processor.

12. Apparatus as recited in claim 11 wherein said plurality of predefined control signals include a configuration control signal for redirecting said plurality of select signals for each service processor to a selected set of said target interfaces.

13. Apparatus as recited in claim 1 includes a pair of redundant ATTENTION mask functions respectively coupled to said pair of second multiplexers for individual target interface masking.

14. Apparatus as recited in claim 1 includes a pair of redundant interface registers for encoding values for selecting one of said plurality of said target interfaces, each one of said pair of redundant interface registers respectively coupled to a respective one of said redundant selector functions.

15. A method for customizing and monitoring multiple interfaces with a controller, said method comprising the steps:
   connecting a first interface to a pair of master sources;
   connecting a second interface to a plurality of target interfaces;
   connecting a third interface to a second controller for coupling a plurality of predefined control signals;
   providing a first multiplexer coupled between said pair of master sources and said second interface to said plurality of target interfaces;
   providing a pair of second multiplexers coupled between said second interface to said plurality of target interfaces and a respective one of said pair of master sources;
   utilizing a pair of redundant selector functions for coupling a select signal to said first multiplexer for selecting one of said plurality of target interfaces; and
   utilizing a pair of redundant ATTENTION monitor functions for monitoring ATTENTION signals for each of said plurality of target interfaces.

16. A method as recited in claim 15 wherein the step of connecting said third interface to said second controller for coupling said plurality of predefined control signals includes the step of providing a master control signal for controlling a master status for one of each of said pairs of redundant selector functions and ATTENTION monitor functions.

17. A method as recited in claim 15 wherein the step of connecting said third interface to said plurality of predefined control signals includes the step of providing an isolate control signal for providing isolation for hot plugging support on said first interface and said second interface.

18. A method as recited in claim 15 wherein the step of connecting said third interface to said plurality of predefined control signals includes the step of providing a configuration control signal for redirecting a plurality of select signals for each master source to a selected set of said target interfaces.

19. A method as recited in claim 15 wherein the step of connecting said third interface to said plurality of predefined control signals includes the step of providing a priority configuration control signal for controlling a master status for one of each said redundant selector and ATTENTION monitoring functions or for one of said interface controller and said second controller.

20. A method as recited in claim 15 includes the step of providing a respective interface register respectively coupled to one of said pair of redundant selector functions for encoding values for selecting one of said plurality of target interfaces.

* * * * *